US012417940B2

(12) United States Patent
Fitzgerald

(10) Patent No.: US 12,417,940 B2
(45) Date of Patent: Sep. 16, 2025

(54) VENTED SUSCEPTOR

(71) Applicant: ASM IP HOLDING B.V., Almere (NL)

(72) Inventor: Thomas Fitzgerald, Gilbert, AZ (US)

(73) Assignee: ASM IP Holding B.V., Almere (NL)

( * ) Notice: Subject to any disclaimer, the term of this patent is extended or adjusted under 35 U.S.C. 154(b) by 1016 days.

(21) Appl. No.: 17/354,879

(22) Filed: Jun. 22, 2021

(65) Prior Publication Data

US 2021/0398843 A1    Dec. 23, 2021

Related U.S. Application Data

(60) Provisional application No. 63/042,974, filed on Jun. 23, 2020.

(51) Int. Cl.
*H01L 21/687* (2006.01)
*C23C 16/455* (2006.01)
*C23C 16/458* (2006.01)
*H01L 21/67* (2006.01)

(52) U.S. Cl.
CPC .... *H01L 21/68785* (2013.01); *C23C 16/4586* (2013.01); *H01L 21/67109* (2013.01); *H01L 21/68735* (2013.01); *H01L 21/68742* (2013.01); *C23C 16/45544* (2013.01)

(58) Field of Classification Search
CPC ........ C23C 16/45521; C23C 16/45544; C23C 16/4581; C23C 16/4586; C23C 16/466; H01J 37/32715; H01J 37/32724; H01L 21/67109; H01L 21/68735; H01L 21/68742; H01L 21/6875; H01L 21/68785
See application file for complete search history.

(56) References Cited

U.S. PATENT DOCUMENTS 3,407,783 A   10/1968   Capita
3,549,847 A   12/1970   Clark et al.
3,641,974 A    2/1972   Yamada et al.
4,522,149 A    6/1985   Garbis et al.
(Continued)

FOREIGN PATENT DOCUMENTS

EP    0339279    11/1989
EP    0448346     3/1991
(Continued)

OTHER PUBLICATIONS

"Shaping the Future in Semiconductor Processing." Advertisement for Morton International, Inc., *Ceramic Solutions*. vol. 73, No. 7, Jul. 1994: advertisements (circa 1993).

*Primary Examiner* — Benjamin Kendall
(74) *Attorney, Agent, or Firm* — Snell & Wilmer L.L.P.

(57) ABSTRACT

A susceptor can include a face that is configured to support a substrate thereon and a plurality of channels extending into the face and radially outwardly relative to a center of the face. One or more of the plurality of channels may include an elongate portion and a flash-out portion. The elongate portion may have a width less than a threshold width along the entirety of the elongate portion. The flash-out portion may be in fluid communication with the elongate portion and may include a first section having a first width and a second section having a second width greater than the first width. The first section may be disposed radially inward of the second section.

20 Claims, 11 Drawing Sheets

(56) References Cited

U.S. PATENT DOCUMENTS

| | | | |
|---|---|---|---|
| 4,560,420 A | 12/1985 | Lord |
| 4,710,428 A | 12/1987 | Tamamizu et al. |
| 4,821,674 A | 4/1989 | deBoer et al. |
| 4,958,061 A | 9/1990 | Wakabayashi et al. |
| 4,978,567 A | 12/1990 | Miller |
| 4,986,215 A | 1/1991 | Yamada et al. |
| 4,990,374 A | 2/1991 | Keeley et al. |
| 5,033,407 A | 7/1991 | Mizuno et al. |
| 5,044,943 A | 9/1991 | Bowman et al. |
| 5,098,198 A | 3/1992 | Nulman et al. |
| 5,108,792 A | 4/1992 | Anderson et al. |
| 5,119,540 A | 6/1992 | Kong et al. |
| 5,119,541 A | 6/1992 | Ohmi et al. |
| 5,121,531 A | 6/1992 | Severns et al. |
| 5,156,820 A | 10/1992 | Wong et al. |
| 5,188,501 A | 2/1993 | Tomita et al. |
| 5,199,483 A | 4/1993 | Bahng |
| 5,200,157 A | 4/1993 | Toya et al. |
| 5,242,501 A | 9/1993 | McDiarmid |
| 5,292,554 A | 3/1994 | Sinha et al. |
| 5,298,465 A | 3/1994 | Levy |
| 5,304,248 A | 4/1994 | Cheng et al. |
| 5,306,699 A | 4/1994 | Eddy |
| 5,308,645 A | 5/1994 | Zachman et al. |
| 5,332,442 A | 7/1994 | Kubodera et al. |
| 5,343,938 A | 9/1994 | Schmidt |
| 5,354,715 A | 10/1994 | Wang et al. |
| 5,356,486 A | 10/1994 | Sugarman et al. |
| 5,370,739 A | 12/1994 | Foster et al. |
| 5,383,971 A | 1/1995 | Selbrede |
| 5,393,349 A | 2/1995 | Ohkase |
| 5,403,401 A | 4/1995 | Haafkens et al. |
| 5,421,893 A | 6/1995 | Perlov |
| 5,427,620 A | 6/1995 | deBoer et al. |
| 5,444,217 A | 8/1995 | Moore et al. |
| 5,455,069 A | 10/1995 | Lee |
| 5,456,757 A | 10/1995 | Aruga et al. |
| 5,461,214 A | 10/1995 | Peck et al. |
| 5,467,220 A | 11/1995 | Xu |
| 5,492,566 A | 2/1996 | Sumnitsch |
| 5,514,439 A | 5/1996 | Sibley |
| 5,527,393 A | 6/1996 | Sato et al. |
| 5,549,756 A | 8/1996 | Sorensen et al. |
| 5,551,985 A | 9/1996 | Brors et al. |
| 5,558,717 A | 9/1996 | Zhao et al. |
| 5,584,936 A | 12/1996 | Pickering et al. |
| 5,588,827 A | 12/1996 | Muka |
| 5,620,525 A | 4/1997 | van de Vens et al. |
| 5,645,646 A | 7/1997 | Beinglass et al. |
| 5,656,093 A | 8/1997 | Burkhart et al. |
| 5,683,518 A | 11/1997 | Moore et al. |
| 5,690,742 A | 11/1997 | Ogata et al. |
| 5,700,725 A | 12/1997 | Hower et al. |
| 5,738,165 A | 4/1998 | Imai |
| 5,738,751 A * | 4/1998 | Camerson ......... H01L 21/67103 |
| | | 118/724 |
| 5,753,132 A * | 5/1998 | Shamouilian ....... H01L 21/6833 |
| | | 216/33 |
| 5,761,023 A | 6/1998 | Lue et al. |
| 5,800,622 A | 9/1998 | Takemi et al. |
| 5,803,977 A | 9/1998 | Tepman et al. |
| 5,810,933 A * | 9/1998 | Mountsier ......... H01L 21/67109 |
| | | 118/728 |
| 5,822,171 A * | 10/1998 | Shamouilian ....... C23C 16/4586 |
| | | 279/128 |
| 5,834,737 A | 11/1998 | Hirose et al. |
| D404,370 S | 1/1999 | Kimura |
| 5,895,530 A | 4/1999 | Shrotriya et al. |
| 5,938,850 A | 8/1999 | Arami et al. |
| 5,960,159 A | 9/1999 | Ikeda et al. |
| 6,001,183 A | 12/1999 | Gurary et al. |
| 6,020,212 A | 2/2000 | Mathis |
| 6,077,357 A | 6/2000 | Rossman et al. |
| 6,086,680 A | 7/2000 | Foster et al. |
| 6,090,212 A | 7/2000 | Mahawili |
| 6,093,252 A | 7/2000 | Wengert et al. |
| 6,167,834 B1 | 1/2001 | Wang et al. |
| 6,293,749 B1 | 9/2001 | Raaijmakers et al. |
| 6,325,858 B1 | 12/2001 | Wengert et al. |
| 6,343,183 B1 | 1/2002 | Halpin et al. |
| 6,394,797 B1 | 5/2002 | Sugaya et al. |
| 6,402,850 B1 | 6/2002 | Beinglass et al. |
| 6,608,287 B2 | 8/2003 | Halpin et al. |
| 6,634,882 B2 | 10/2003 | Goodman |
| 6,709,267 B1 | 3/2004 | Hawkins et al. |
| D496,008 S | 9/2004 | Takahashi et al. |
| 6,893,507 B2 | 5/2005 | Goodman et al. |
| 7,033,445 B2 | 4/2006 | Keeton et al. |
| D525,127 S | 7/2006 | Cogley et al. |
| 7,601,224 B2 | 10/2009 | Foree |
| 7,602,224 B2 | 10/2009 | Foree |
| 7,648,579 B2 | 1/2010 | Goodman et al. |
| 7,705,275 B2 * | 4/2010 | Umotoy ................ C23C 16/466 |
| | | 219/401 |
| 8,088,225 B2 | 1/2012 | Goodman et al. |
| 8,394,229 B2 | 3/2013 | Aggarwal et al. |
| 8,801,857 B2 | 8/2014 | Aggarwal et al. |
| 9,972,520 B2 | 5/2018 | Kuo et al. |
| 2002/0011211 A1 | 1/2002 | Halpin |
| 2002/0043337 A1 * | 4/2002 | Goodman ......... H01L 21/68728 |
| | | 156/345.12 |
| 2002/0189940 A1 * | 12/2002 | Tsai ....................... C30B 25/12 |
| | | 118/724 |
| 2003/0000472 A1 | 1/2003 | Lim et al. |
| 2003/0049580 A1 | 3/2003 | Goodman |
| 2004/0060512 A1 | 4/2004 | Waldhauer et al. |
| 2004/0229002 A1 | 11/2004 | Davis et al. |
| 2005/0092439 A1 | 5/2005 | Keeton et al. |
| 2005/0284372 A1 | 12/2005 | Murugesh et al. |
| 2006/0057826 A1 | 3/2006 | De Boer |
| 2009/0014323 A1 * | 1/2009 | Yendler ................... H01J 37/20 |
| | | 204/298.33 |
| 2009/0280248 A1 | 11/2009 | Goodman et al. |
| 2010/0031884 A1 | 2/2010 | Aggarwal et al. |
| 2010/0107974 A1 | 5/2010 | Givens et al. |
| 2011/0209660 A1 * | 9/2011 | Myo ..................... C23C 16/4586 |
| | | 117/88 |
| 2013/0109192 A1 | 5/2013 | Hawkins et al. |
| 2015/0232983 A1 | 8/2015 | West et al. |
| 2018/0094350 A1 | 4/2018 | Verghese et al. |
| 2019/0139807 A1 * | 5/2019 | White ............... H01L 21/68764 |
| 2023/0019718 A1 | 1/2023 | Larosa et al. |

FOREIGN PATENT DOCUMENTS

| | | |
|---|---|---|
| EP | 0445596 | 9/1991 |
| EP | 0634785 | 1/1995 |
| EP | 0669640 | 8/1995 |
| EP | 0766289 | 4/1997 |
| EP | 0840358 | 5/1998 |
| GB | 2181458 | 4/1987 |
| JP | 7-58039 | 3/1995 |
| JP | 2000-269310 | 9/2000 |
| JP | 2002-184843 | 6/2002 |
| JP | 2002-526915 | 8/2002 |
| JP | 2003-124167 | 4/2003 |
| JP | 2006-228802 | 8/2006 |
| JP | 2007-502022 | 2/2007 |
| KR | 10-1999-0069084 | 9/1999 |
| KR | 100460338 B1 | 11/2004 |
| KR | 10-2007-0098025 | 10/2007 |
| WO | WO 96/30713 | 10/1996 |
| WO | WO 97/08743 | 3/1997 |
| WO | WO 2010/016964 | 2/2010 |

* cited by examiner

VENTED SUSCEPTOR

CROSS-REFERENCE TO RELATED APPLICATIONS

This application claims the priority benefit under 35 U.S.C. § 119(e) of U.S. Provisional Application No. 63/042,974, filed Jun. 23, 2020, the entirety of which is hereby incorporated by reference herein.

BACKGROUND

Field of the Disclosure

This disclosure relates generally to semiconductor processing, and more particularly to susceptors for supporting semiconductor substrates in process chambers.

Description of the Related Art

Semiconductor fabrication processes are typically conducted with the substrates supported within a reaction chamber on a susceptor under controlled process conditions. For many processes, semiconductor substrates (e.g., wafers) are heated inside the reaction chamber. A number of quality control issues related to the physical interaction between the substrate and the susceptor can arise during processing.

DETAILED DESCRIPTION

Figure 1:
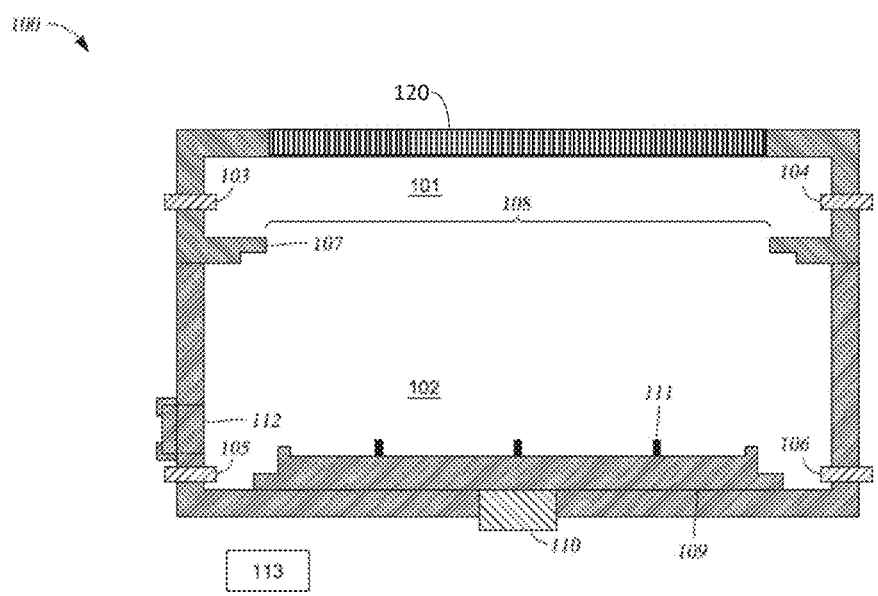
FIG. 1 schematically illustrates an embodiment of a semiconductor processing apparatus comprising a reaction chamber and a loading chamber with a susceptor in a loading position.

Susceptors are commonly formed by machining graphite into a desired shape and applying a silicon carbide (SiC) coating or by sintering layers of Aluminum Nitride. Susceptors can be formed in different shapes, but many are circular.

As noted above, a number of quality control issues can arise during processing, relating to the physical interaction between the substrate and the susceptor. These issues can include, for example, substrate sliding, sticking, and curling, and backside deposition. Such quality control issues can decrease the overall quality of the substrates and semiconductor devices, resulting in reduced yield and increased costs.

Backside deposition occurs when process gases flow into the space between the substrate and the susceptor and deposit on a back surface of the substrate. Because the flow of the process gases is not controlled between the substrate and the susceptor, random deposition can occur on the backside of the substrate. This random deposition can create thickness inconsistencies on the backside, which can affect local site flatness on the front side, and ultimately cause device uniformity issues.

In a typical process, a reactant gas is passed over the heated wafer, causing the atomic layer deposition (ALD) of a thin layer of reactant material on the wafer. Through sequential processing, multiple layers are made into integrated circuits. Other exemplary processes include sputter deposition, photolithography, dry etching, plasma processing, and high temperature annealing. Many of these processes require high temperatures and can be performed in the same or similar reaction chambers.

Wafers may be processed at various temperatures to promote high quality deposition. Temperature control is especially helpful at temperatures below the mass transport regime, such as about 500° C. to 900° C. for silicon CVD using silane. In this kinetic regime, if the temperature is not uniform across the surface of the wafer, the deposited film thickness will be uneven. However, lower temperatures may sometimes be used in certain scenarios.

Wafers may be made of silicon, most commonly with a diameter of about 150 mm (about 6 inches) or of about 200 mm (about 8 inches) and with a thickness of about 0.725 mm. Recently, larger silicon wafers with a diameter of about 300 mm (about 12 inches) and a thickness of about 0.775 mm have been utilized because they exploit the benefits of single-wafer processing even more efficiently. Even larger wafers are expected in the future. A typical single-wafer susceptor includes a pocket or recess within which the wafer rests during processing. In many cases, the recess is shaped to receive the wafer very closely.

There are a variety of quality control problems associated with handling of substrates. These problems include substrate slide, stick, and curl. These problems primarily occur during placement and subsequent removal of substrates in high temperature process chambers, particularly single-wafer chambers.

A substrate may be moved within the reaction chamber, for example, to and from a susceptor, by an effector or other robotic substrate handling device, such as a Bernoulli wand. A Bernoulli wand is described in U.S. Pat. No. 5,997,588, the entire disclosure of which is hereby incorporated by reference herein for all purposes.

Substrate "slide" or "skate" occurs during substrate unload when a cushion of gas in the susceptor on the upper surface of the susceptor, for example, in the susceptor's recess or pocket is unable to escape fast enough to allow the substrate to quickly and precisely transfer onto the susceptor from the effector. The substrate floats momentarily above the susceptor as the gas slowly escapes, and it tends to drift off-center. Thus, the substrate may not rest in the center of the pocket as normally intended, and uneven heating of the substrate can result. Such drifting of the substrate to the edge of a susceptor can result in poor thickness uniformity, poor resistivity uniformity, and crystallographic slip, depending on the nature of the layer being deposited.

In some embodiments, a plurality of protrusions (e.g., pins, prongs, etc.) may lift the substrate from the susceptor, to facilitate transfer to or from the susceptor by an effector. During substrate unload, "stick" can occur when the substrate clings to the underlying support because gas is slow to flow into the small space between the substrate and the surface of the substrate support pocket. This creates a vacuum effect between the substrate and the substrate support as the substrate is lifted. Stick can contribute to particle contamination due to scratching against the substrate support and, in extreme cases, can cause lifting of the substrate holder on the order of 1 to 2 mm.

Substrate "curl" is warping of the substrate caused by radial and axial temperature gradients in the substrate. Severe curl can cause a portion of the substrate to contact the bottom side of a Bernoulli wand, for example, when a cold substrate is initially dropped onto a hot substrate support such as a susceptor. Curl can similarly affect interaction with other robotic substrate handling devices. In the case of a Bernoulli wand, the top side of the substrate can scratch the Bernoulli wand, causing particulate contamination on the substrate. This significantly reduces yield.

A susceptor can include flow channels or perforated designs to reduce slide, stick, curl, backside deposition, and other substrate processing quality issues. For example, an upper surface of a susceptor can include channels that allow generally horizontal flow along the upper surface to reduce these issues. However, susceptors that include radially channeled grid designs can still cause backside damage on the substrate. A perforated susceptor can include additional vent channels that allow flow through an upper surface of the susceptor (e.g., vertically) to prevent such damage. Nonetheless, in some susceptors, backside deposition may still occur on perforated substrates that include such vents. Additionally, vent holes may have disadvantageous locations or be incompatible with grids or other channeled structures that allow gases to access the backside of the susceptor. Embodiments of horizontal channels that provide improved venting, and/or with reduced substrate stick may be a solution to these problems, as described in more detail below. Some embodiments may also provide aesthetically pleasing benefits.

Reference will now be made to the Figures. FIG. 1 schematically illustrates an embodiment of a semiconductor processing apparatus 100 comprising a reaction chamber 101 and a loading chamber 102. Together, the reaction chamber 101 and the loading chamber 102 may be considered a process module, for example, to be implemented into multi-module "cluster" tools. In the illustrated embodiment, the reaction chamber 101 is disposed above the loading chamber 102, and they are separated by a baseplate 107 and a movable pedestal or workpiece support 109, described in more detail below. The workpiece support 109 can comprise a susceptor, as used elsewhere herein.

In some embodiments, the reaction chamber 101 may be substantially smaller than the loading chamber 102, contrary to the schematic drawings, which are not drawn to scale. For a single wafer process module, as shown, the reaction chamber 101 may have a volume between about 0.25 liters and 3 liters. In some embodiments, the reaction chamber 101 may have a volume of less than about 1 liter. In some embodiments, the reaction chamber 101 may be about 900 mm long, 600 mm wide, and 5 mm high. In some embodiments, the loading chamber 102 may have a volume between about 30 liters and about 50 liters. In some embodiments, the loading chamber 102 may have a volume of about 40 liters. In some embodiments, the loading chamber 102 may have a volume about 35-45 times the volume of the reaction chamber 101.

In some embodiments, the reaction chamber 101 may comprise one or more inlets 103 (one shown) and one or more outlets 104 (one shown). During processing, gases such as reactants and purge gases may flow into the reaction chamber 101 through the reaction chamber inlet 103, and gases such as excess reactants, reactant byproducts, and purge gases may flow out of the reaction chamber 101 through the reaction chamber outlet 104. In some embodiments, the loading chamber 102 may comprise one or more inlets 105 (one shown) and one or more outlets 106 (one shown). In operation, gases such as purge gases may flow into the loading chamber 102 through the loading chamber inlet 105, and gases such as excess reactants, reactant byproducts, and purge gases may flow out of the loading chamber 102 through the loading chamber outlet 106. The depicted configuration, such as the positions of the inlets 103, 105 and outlets 104, 106 are merely schematic, and may be adjusted based on, for example, the process to be performed in the reaction chamber 101, the desired flow path of the gases, etc. Purge gases can include a single purge gas or a mixture of purge gases. For example, in some embodiments, the purge gas can consist essentially of one or more inert gases, such as one or more noble gases (e.g., helium, argon, neon, xenon, etc.). The purge gas can include one or more inert gases without any reactive gases. In other embodiments, the purge gas can include, for example, one or more inert gases and one or more other non-inert gases. The purge gas can include an inert gas mixed with a reactive gas, such as hydrogen. The purge gas may include a mixture of hydrogen and argon, for example. In some embodiments, a first purge gas consisting essentially of one or more inert gases (i.e., without any reactive gases) can be used in a first purge step, and a second purge gas comprising a mixture of one or more inert gases mixed with one or more reactive gases can be used in a second purge step. In some embodiments, this second purge step sequentially follows this first purge step. Using a purge step that includes one or more inert gases with one or more reactive gases may help improve the distribution of a reactant across the substrate. For example, a delivery system (e.g., shower or showerhead) may generally concentrate the reactant near a center of the substrate. The delivery system can cause gas to flow substantially perpendicularly to a face of the substrate. During a second purge step, a mixture of inert and reactive gases can provide a better distribution of reactant near, for example, the edges of the substrate. In some embodiments, a gas, such as a purge gas, can be flowed through, within, and/or along a portion of the workpiece support 109. Such embodiments can provide purge gas along a backside of a substrate positioned on support 109, to prevent backside substrate deposition.

In the illustrated embodiment, the reaction chamber 101 comprises a baseplate 107 including an opening 108. An interior edge of the baseplate 107 defines the opening 108. In some embodiments, the baseplate 107 may comprise titanium. In the illustrated embodiment, the reaction chamber inlet 103 is located approximately opposite to the reaction chamber outlet 104, such that reaction gas that flows from the reaction chamber inlet 103 to the reaction chamber outlet 104 travels approximately parallel to a face of the workpiece W, and thus parallel to the upper surface of the moveable support. Such reactors are sometimes referred to as "cross-flow" or horizontal laminar flow reactors. In some embodiments, the reaction chamber 101 can include an inlet, or plurality of inlets, such as a showerhead 120, positioned above the susceptor, to form a vertical flow reactor, or "showerhead" reactor, which provides reactant directed perpendicular to an upper surface of a substrate. For example, the top wall of chamber 101 as shown can be configured as a showerhead 120, or can include a showerhead attached thereto. An example of a showerhead implemented within a reaction chamber is described in U.S. Pat. App. Pub. No. 2019/0139807, the entire disclosure of which is hereby incorporated by reference herein for all purposes.

In some embodiments, the apparatus 100 may be an atomic layer deposition (ALD) reactor, such that it includes valves controlled by a control system 113 to separately provide pulses of reactants. In some embodiments, apparatus 100 may include two or more valves independently controlled by control system 113 to allow regulation of relative pressure and/or the direction of flow between reaction chamber 101 and loading chamber 102. In some embodiments, the reaction chamber inlet 103 may comprise a distribution system such to distribute gas in a desirable pattern. In some embodiments, the reaction chamber 101 may taper near the reaction chamber outlet 104, such that the height of the reaction chamber 101 decreases near the reaction chamber outlet 104, thereby constricting air flow through the reaction chamber outlet 104. Although the apparatus 100 may be described herein with respect to vapor deposition (e.g., chemical vapor deposition, or CVD, and/or atomic layer vapor deposition, or ALD) reactors, the apparatus 100 may alternatively comprise other semiconductor processing tools, including, but not limited to, dry etchers, ashers, rapid thermal annealers, etc.

The apparatus 100 further comprises the moveable support 109, configured to be moved between a loading position and a processing position by operation of a drive mechanism 110. FIG. 1 depicts the support 109 in the loading position, according to one embodiment. The support 109 may be configured to hold a workpiece (semiconductor workpiece W see FIG. 2), such as a silicon wafer. The workpiece W may be loaded and unloaded into the support 109 in various ways, such as with an end effector of a robot. The support 109 may comprise lift-pins 111 and/or cutouts to aid in loading and unloading of the workpiece W with a paddle or fork. The support 109 may comprise a vacuum system that holds the workpiece W in place after loading, or gravity alone may hold the workpiece W in a pocket that is sized and shaped to accommodate the workpiece W. The apparatus 100 may further comprise one or more gate valves 112 (one shown) for loading and unloading of workpieces W to and from the support 109. The gate valve 112 may allow access to, for example, a transfer chamber, load lock, processing chamber, clean room, etc.

The control system 113 is also configured or programmed to control the drive mechanism 110. In some embodiments, the drive mechanism 110 may comprise a piston or elevator that imparts vertical movement to the support 109. The drive mechanism 110 is therefore configured to move the support 109, and thus the workpiece W disposed on the support 109, into the processing position during a reactor closure operation and into the loading position during a reactor opening operation. The drive mechanism 110 can also be configured to rotate the workpiece W disposed on the support 109.

Figure 2:
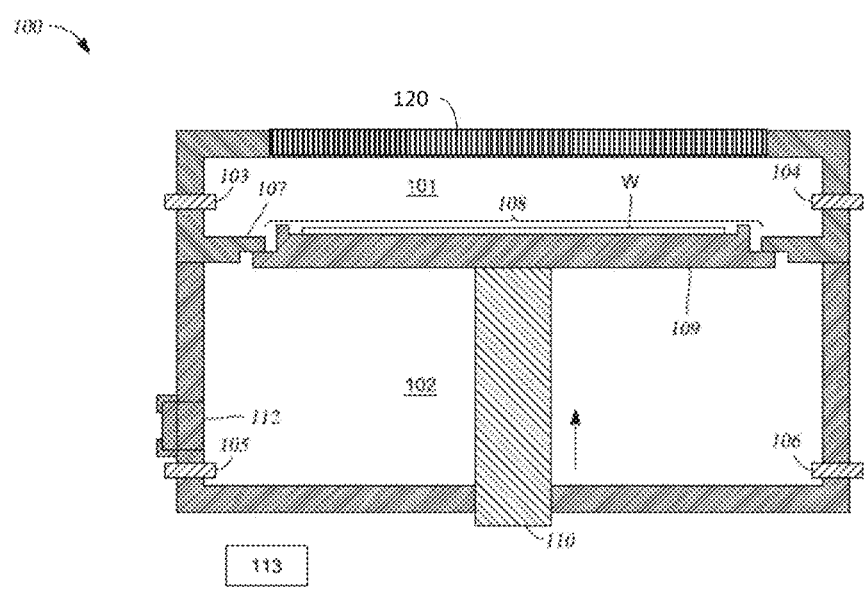
FIG. 2 shows the apparatus of FIG. 1 with the susceptor in a processing position.

FIG. 2 schematically illustrates the apparatus 100 with the support 109 shown in the processing position, according to one embodiment. When in the processing position, the support 109 engages the baseplate 107, effectively isolating or separating the interior of the reaction chamber 101 from the loading chamber 102. Such isolation can reduce contamination between the reaction chamber 101 and the loading chamber 102. In some embodiments, engaging may comprise creating a hard metal-on-metal seal between the baseplate 107 and the support 109. In some embodiments, engaging may comprise compression of pliable material, such as an O-ring, on either part, to create a soft seal between the baseplate 107 and the support 109. In some embodiments, engaging may comprise maintaining a gap between the support 109 and the baseplate 107, such that there is no absolute seal. Even where engaging comprises maintaining a gap between the support 109 and the baseplate 107, the support may still effectively separate the reaction chamber 101 from the loading chamber 102 by creating a substantial barrier to fluid communication between the reaction chamber 101 and the loading chamber 102 when apparatus 100 is in the processing position.

Figure 3:
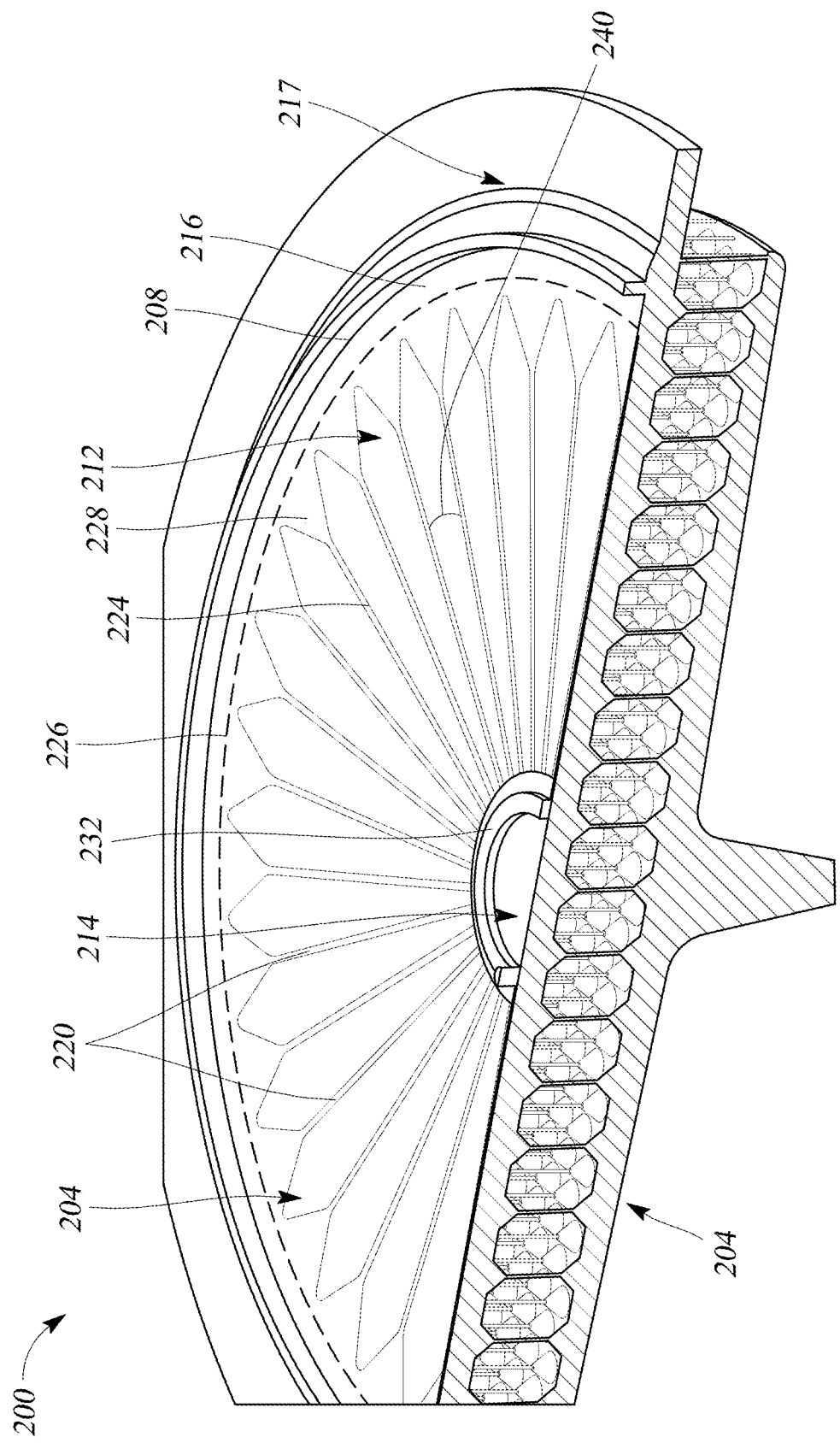
FIG. 3 shows an example susceptor that may be used to support a substrate (e.g., wafer).

FIG. 3 shows a fluid volume of an example susceptor 200 that may be used to support a substrate (e.g., wafer). The susceptor 200 can include an outer edge 208 forming an outer perimeter around a face 204. The face 204 can include a channel region 212 positioned outwardly from an inner region 214. The face 204 may further include one or more channels 220. The susceptor 200 may comprise one or more materials, such as elemental or molecular materials. Such materials can include non-oxide ceramics, such as silicon carbide (SiC or CSi), graphite, or any other ceramic. Other materials may be used, such as metal. In some embodiments, the susceptor 200 may include a silicon carbide coating, such as silicon-carbide-coated graphite. The face 204 may be configured to hold or support the substrate (not shown).

The rim region 217 can be positioned radially outwardly from the channel region, and may provide additional structural integrity and/or easier access to portions of the susceptor 200 as needed. The rim region 217 may be bounded between the edge 208 and an outer radial boundary of the channel region 212. In some embodiments, the functionality of the rim region 217 may be performed by the baseplate 107 of FIG. 2. The channel region 212 may be bounded by the outer rim 216 and an inner boundary, such as an inner rim 232 or inner channel ring. Any "boundary" described herein may be a subtle difference in rise angle, material, curvature/concavity, smoothness, and/or other difference between adjacent regions. The rim region 217 may be substantially flat and/or smooth. For example, the rim region 217 may be substantially free of channels, protrusions, holes, and/or other irregularities in the surface of the rim region 217. The rim region 217 can have a radial width (defined as the radial distance between the edge 208 and the outer radial boundary) of between about 15 mm and 35 mm.

The channel region 212 can be positioned between the outer rim 216 and the inner rim 232. One or both of the outer rim 216 and/or the inner rim 232 may be round, such as substantially a circle or other rounded shape (e.g., oval). The inner region 214 may be substantially flat and/or smooth. For example, the inner region 214 may be substantially free of channels, protrusions, and/or other irregularities. The inner region 214 can be shaped and/or sized to provide additional structural integrity to the susceptor 200. For example, an inclusion of irregularities within the inner region 214 may reduce the strength of the inner region 214. In some embodiments, the inner region 214 is recessed relative to the surrounding channel region 212.

The channel region 212 may be disposed adjacent and/or radially inward of the rim region 217. The channel region 212 may be disposed between the rim region 217 and the inner region 214. Within the channel region 212, one or more channels 220 may be formed within the face 204, but for convenience, reference will be made to a plurality of channels 220 throughout. The channels 220 may extend radially outwardly relative to a center of the face 204 or from near a center of the face 204 towards (and in some embodiments, to and through) the edge 208. In some embodiments, the channels 220 can extend from or near the inner rim 232 to or near the outer rim 216. In some embodiments, the channels 220 may extend substantially radially from the center of the face 204 and/or to and through the edge 208. In some embodiments, consecutive channels 220 may form an angular separation or angle 240. Consecutive channels may be referred to as "adjacent" or "neighboring." The angle 240 can be an acute angle. For example, the angle 240 may be between about 5° and 35° and in some embodiments is about 15° between at least two consecutive channels 220. Consecutive channels 220 may be referred to as successive or adjacent channels 220 herein. A plurality of regularly spaced consecutive channels 220 may have a substantially the same angle 240 between each set of consecutive channels 220. As shown, the face 204 may include multiple sets of such pluralities of consecutive channels 220. The regularity of angle 240 may be interrupted, for example, by one or more irregularities in the channel region 212. For example, as shown, one or more apertures 256 and/or raised features 234 (shown in FIG. 4A) may be included in the channel region. The apertures 256 may be configured to allow raisers (e.g., pins, prongs, rods, etc.) therethrough. The raisers may be used by a susceptor support apparatus (e.g., a spider) (not shown) to raise a wafer up from the susceptor 200 without raising the susceptor 200 itself. Accordingly, an angle 240 between consecutive channels 220 where irregularities may be found can be greater, such as double the angle 240 described above. Such increased angular separation can provide additional structural integrity to those portions of the susceptor which include apertures 256, and/or can provide additional space to avoid interference with the raisers and susceptor support apparatus.

The channel region 212 can form a "pocket" or recess into which the substrate may rest. The outer rim 216 or other outer boundary can form the outer boundary of this pocket. The channel region 212 may have a sloped and/or concave surface, which forms an elevated portion, relative to the inner region 214, to limit the amount of the substrate (e.g., an edge or rim of the substrate) that is touching the susceptor 200. The majority of surface area of the channel region 212 may be substantially flat and/or smooth. One or more portions of the channel region disposed between consecutive channels 220 may increase in area moving from the inner rim 232 to the outer rim 216. One or more of the channels 220 may be substantially straight. The number of channels 220 within the channel region can be between about 3 and 72, or between about 18 and 30, but other variants are also possible. In some embodiments, the number of channels is 36.

The channel region 212 may be tapered, such that it is disposed at a slight incline to allow a substrate to rest on only a portion of the channel region 212. A rise angle of the channel region 212 relative to the back surface 206 may be between about 0.5° and 5° and in some embodiments is about 3°. The rise angle can be an absolute value (for example, when the inner channel region 124 is substantially flat). In some embodiments, the cross sectional shape (e.g., the cross section shown in FIG. 3) of channel region 212 can be recessed, e.g., concave. The channel region 212 may thus be configured to provide edge support of a substrate, and thus reduce substrate contact with the susceptor 200.

The susceptor may be surface-treated to improve performance. For example, one or more regions of the face 204 may be polished to reduce the likelihood of deformities (e.g., caused by substrate sticking) to affect the substrate. Portions of the susceptor 200 may be coated to improve performance. For example, the face 204 may be coated with silicon carbide.

FIG. 3 also shows how each of the channels 220 can include a corresponding elongate portion 224 and a flash-out portion 228. A width and/or cross sectional area of each of the elongate portions 224 may be substantially constant along a radial length of the elongate portion 224. Each elongate portion 224 may have a width that is less than or equal to a threshold width along the entirety of the elongate channel portion. The threshold width may be about 0.01 mm, about 0.05 mm, about 0.1 mm, about 0.2 mm, about 0.3 mm, about 0.5 mm, about 0.7 mm, about 0.9 mm, about 1 mm, about 1.2 mm, about 1.5 mm, about 1.8 mm, about 2 mm, about 2.5 mm, about 3 mm, about 4 mm, about 5 mm, about 7 mm, about 10 mm, about 15 mm, about 20 mm, any value therein, or fall within a range having endpoints therein. The cross sectional area of the elongate portion may be substantially constant along a radial length of the elongate portion 224. For example, the cross-sectional area may be within (e.g., above or below) a threshold, such as the threshold width above, by a threshold percentage. The threshold percentage may be about 1%, about 3%, about 5%, about 10%, about 15%, about 20%, about 25%, or some other percentage.

One or more of the channels 220 may include a respective flash-out portion 228. The flash-out 228 portion can be in fluid communication with the elongate portion 224. Other details of the flash-out portion 228 are provided below with reference to FIG. 5. In some embodiments, the flash-out portion 228 is disposed radially outward of the elongate portion 224. The flash-out portion 228 can be triangle shaped (e.g., pie-shaped). A distal end of the channels 220 (e.g., the distal end of the flash-out portions 228 and the portions of the face therebetween) can form a purge perimeter 226. The substrate can be supported upon this purge perimeter 226, and during purge, the purge gas flows around this purge perimeter and the edge of the substrate, to prevent backside deposition. The flash-out portions 228 increase the uniformity of flow (e.g., uniformity of velocity and/or pressure) around the purge perimeter 226, to improve yield and reduce backside deposition.

Consecutive elongate portions 224 may form an angle 290 therebetween. The elongate portion 224 may be an acute angle in some embodiments. The elongate portion 224 may be about 10°, about 15°, about 18°, about 20°, about 22°, about 25°, about 27°, about 30°, about 32°, about 33°, about 35°, about 40°, about 42°, about 45°, about 50°, about 55°, about 60°, about 65°, about 70°, about 75°, about 80°, about 90°, about 100°, about 110°, about 120°, about 180°, any value therein, or fall within a range having endpoints therein. The quantity of channels 220, the angles 290 therebetween, the width of the channels, and/or the cross sectional shape and area of the channels 220 may be selected within a range that provides improved uniformity in heat transfer within the susceptor.

Figure 4A:
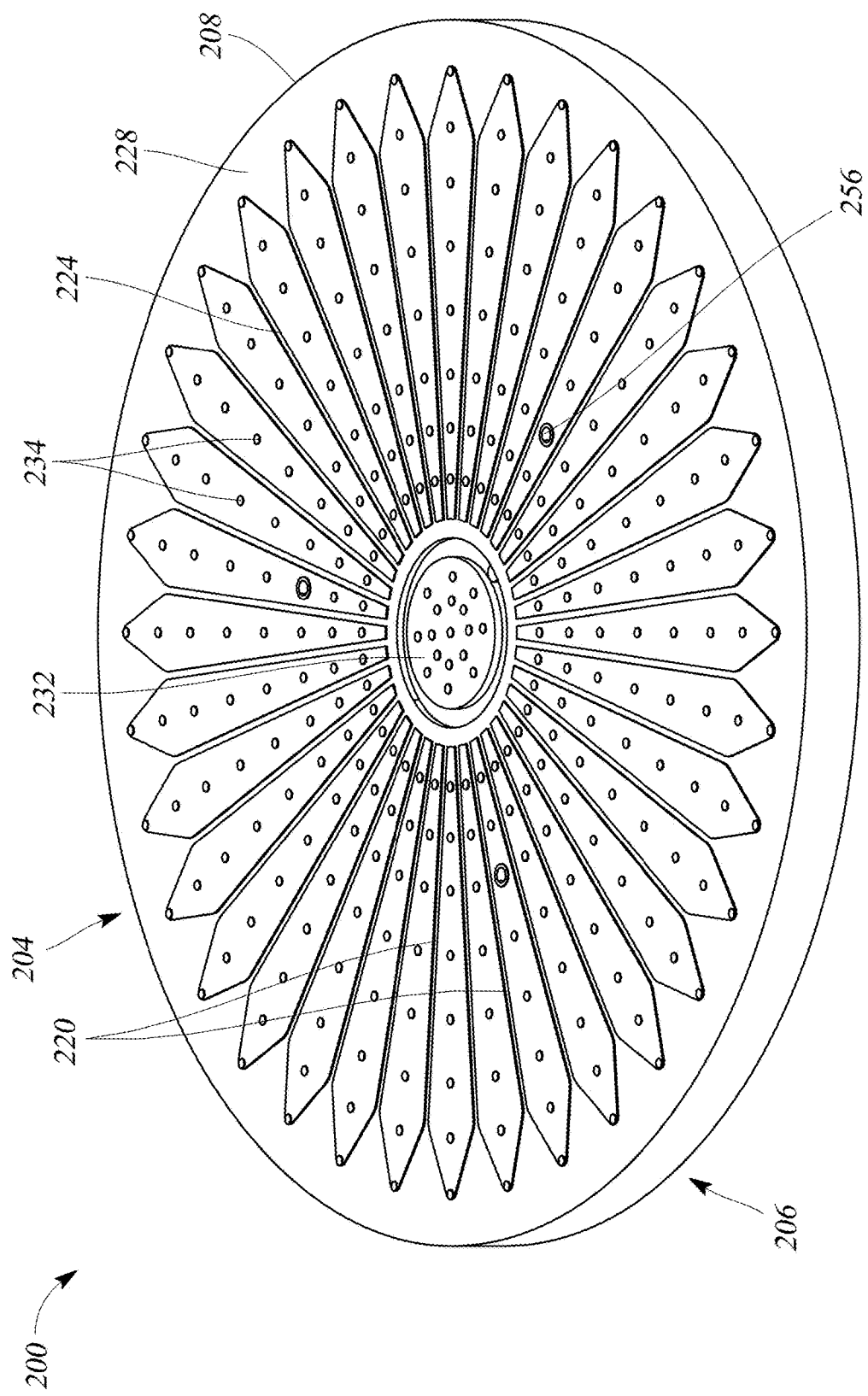
FIG. 4A shows another example susceptor, according to some embodiments.

FIG. 4A shows another example susceptor 200, according to some embodiments. The susceptor 200 shown in FIG. 4A shows a plurality of protrusions 234 and apertures 256. The protrusions 234 may extend upwardly relative to a surrounding portion of the face 204, to provide a small separation between the substrate and the surrounding portion of the front face 204. This separation may improve the functionality and efficacy of any applied or inherent vacuum. The protrusions 234 may help reduce sticking of the substrate to the susceptor 200, and/or may reduce direct contact with the backside of the substrate, which in turn can reduce contamination or potential substrate damage. The protrusions 234 may also improve the uniformity of heat conduction to the substrate.

Figure 4B:
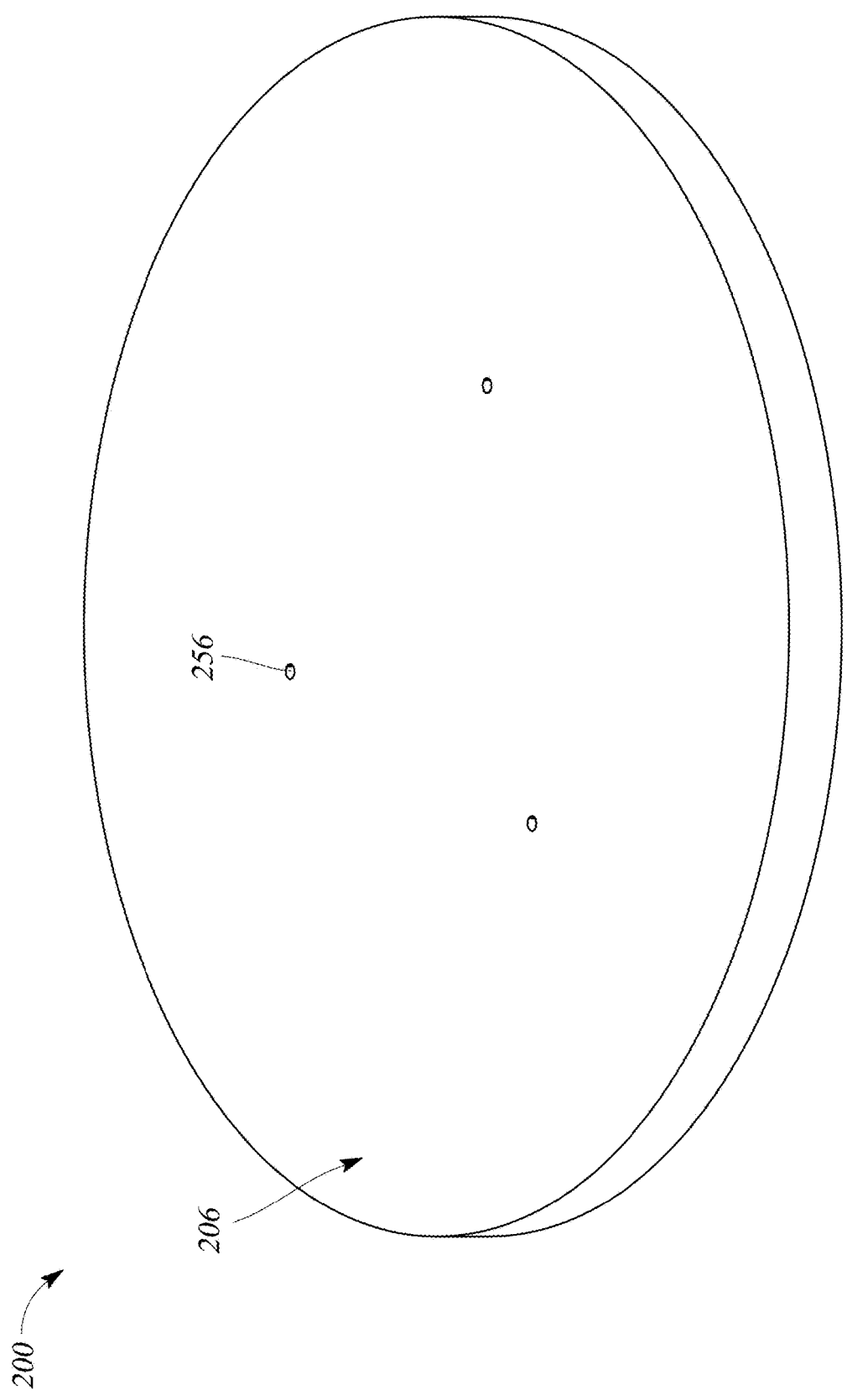
FIG. 4B shows a perspective view of the back surface of the susceptor shown in FIG. 4A.

As shown in FIG. 4A, one or more apertures 256 may be included in the susceptor 200. The apertures 256 may be lift pin holes that allow for lift pins to extend through the susceptor 200. The apertures 256 may allow a substrate (e.g., a wafer) to be placed on the face 204 and/or removed therefrom. The apertures 256 may be disposed radially inward of an outer boundary of the susceptor 200 (e.g., the outer rim 216 shown in FIG. 3, the edge 208, etc.). In some embodiments, the apertures 256 are radially outward from the outer boundary. In some embodiments, there are three lift apertures 256, but another number is possible. The apertures 256 may extend between the face and the back surface and may be configured to allow for pins to extend therethrough. The apertures 256 may be disposed between consecutive elongate portions of a plurality of channels. An angular separation between each radially consecutive aperture may be substantially equal. For example, the angular separation between consecutive apertures where there are three apertures may be about 120°. Other variants are possible. An inner diameter of each of the apertures 256 may be between about 35 mm and 400 mm and in some embodiments is about 160 mm. FIG. 4B shows a perspective view of the back surface 206 of the susceptor 200 shown in FIG. 4A. As shown, the apertures 256 may pass through to the back surface 206.

Figure 5:
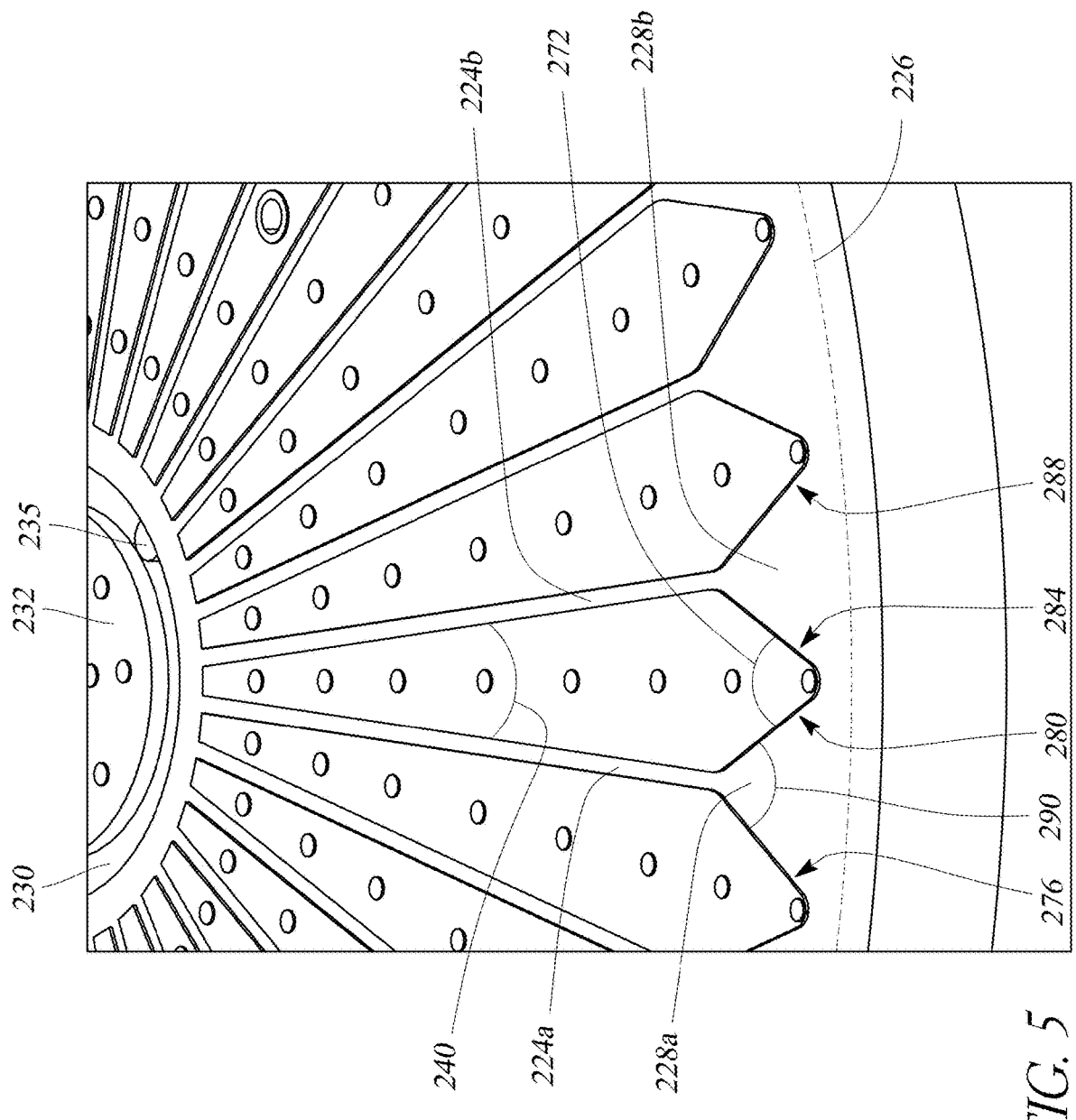
FIG. 5 shows a detail view of a portion of the susceptor shown in FIG. 4A.

FIG. 5 shows a detail view of a portion of the susceptor 200 shown in FIG. 4A. The channels 220 in the face 204 of the susceptor 200 may extend radially outwardly from an inner rim 232. In some embodiments, the channels 220 can extend from the inner radial boundary such as a ring channel 230 or the inner rim 232. The ring channel 230 can extend into the face 204 and be disposed radially inward of and in fluid communication with at least one of the plurality 0. of channels 220. The ring channel 230 can form a volume configured to receive gas (e.g., purge gas) through an opening 235, and provide better pressure uniformity in flow of the gas supply to the plurality of channels 220. The channels 220 may extend substantially radially from the ring channel 230. In some embodiments, consecutive channels 220 may form an angle 240, as shown. The angle 240 can form an acute angle. For example, the angle 240 may be between about 3° and 30° and in some embodiments is about 7.5° between at least two consecutive channels 220. Consecutive channels 220 may be referred to as successive or adjacent channels 220 herein. A plurality of regularly spaced consecutive channels 220 may have substantially the same angle 240 between each set of consecutive channels 220. Though not shown, the face 204 may include multiple sets of such pluralities of consecutive channels 220. The regularity of angle 240 may be interrupted, for example, by one or more irregularities in the face 204. For example, one or more apertures 256 may be included in the channel region. Accordingly, an angle 240 between consecutive channels 220 where irregularities may be found can be greater, such as double the angle 240 described above. Such increased angular separation can provide additional structural integrity and/or can provide additional space to avoid interference with the raisers and susceptor support apparatus. Two consecutive elongate portions 224a, 224b of the plurality of channels can form an angle 240 of about 1°, about 2°, about 3°, about 5°, about 7°, about 10°, about 12°, about 15°, about 18°, about 20°, about 22°, about 25°, about 28°, about 30°, about 33°, about 35°, about 40°, about 45°, any angle therein, or fall within a range having endpoints therein.

Consecutive flash-out portions 228a, 228b can form various angles additionally or alternatively. As shown, a first channel can include a first flash-out portion 228a having a first edge 276 and a second edge 280. The first edge 276 and the second edge 280 can form an angle 290. The angle 290 can be about 1°, about 2°, about 3°, about 5°, about 7°, about 10°, about 12°, about 15°, about 18°, about 20°, about 22°, about 25°, about 28°, about 30°, about 33°, about 35°, about 40°, about 45°, any angle therein, or fall within a range having endpoints therein. As shown, the first edge 276 and the second edge 280 need not come into contact to form the angle 290.

A second flash-out portion 228b may include a corresponding first edge 284 and second edge 288. The second edge 280 of the first flash-out portion 228a may form an angle 272 with the first edge 284 of the second flash-out portion 228b. The angle 272 can be about 1°, about 2°, about 3°, about 5°, about 7°, about 10°, about 12°, about 15°, about 18°, about 20°, about 22°, about 25°, about 28°, about 30°, about 33°, about 35°, about 40°, about 45°, any angle therein, or fall within a range having endpoints therein. As shown, the second edge 280 and the first edge 284 need not come into contact to form the angle 290. For example, a substantially flat connector portion may connect the second edge 280 and the first edge 284.

Figure 6:
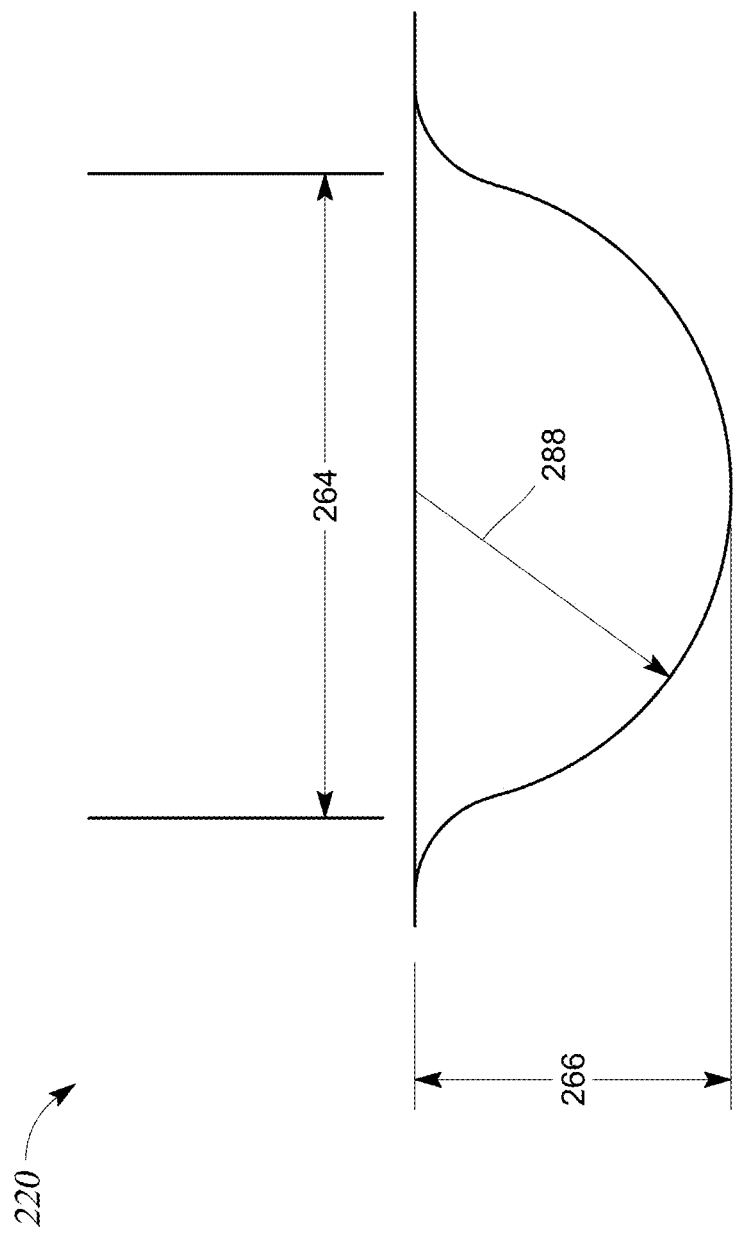
FIG. 6 shows a cross sectional view of an example channel.

FIG. 6 shows a cross sectional view of an example channel 220. Other shapes of the cross section are possible. As shown, the channel 220 can include curvilinear sidewalls. The sidewalls may form substantially a semi-circle along the cross section. The radius 288 of curvature may be between about 0.1 mm and 2.5 mm and is about 0.6 mm in some embodiments. Curved sidewalls as shown may be helpful in preventing the accumulation of gas therein during deposition. The width 264 of the channel 220 may be between about 0.1 mm and 5 mm and in some embodiments is about 1.2 mm. The depth 266 of the channel 220 may be between about 0.05 mm and 1.5 mm and in some embodiments is about 0.6 mm. In some embodiments, the channel 220 can include substantially flat sidewalls. The sidewalls may form an angle such as an acute angle.

Figure 7A:
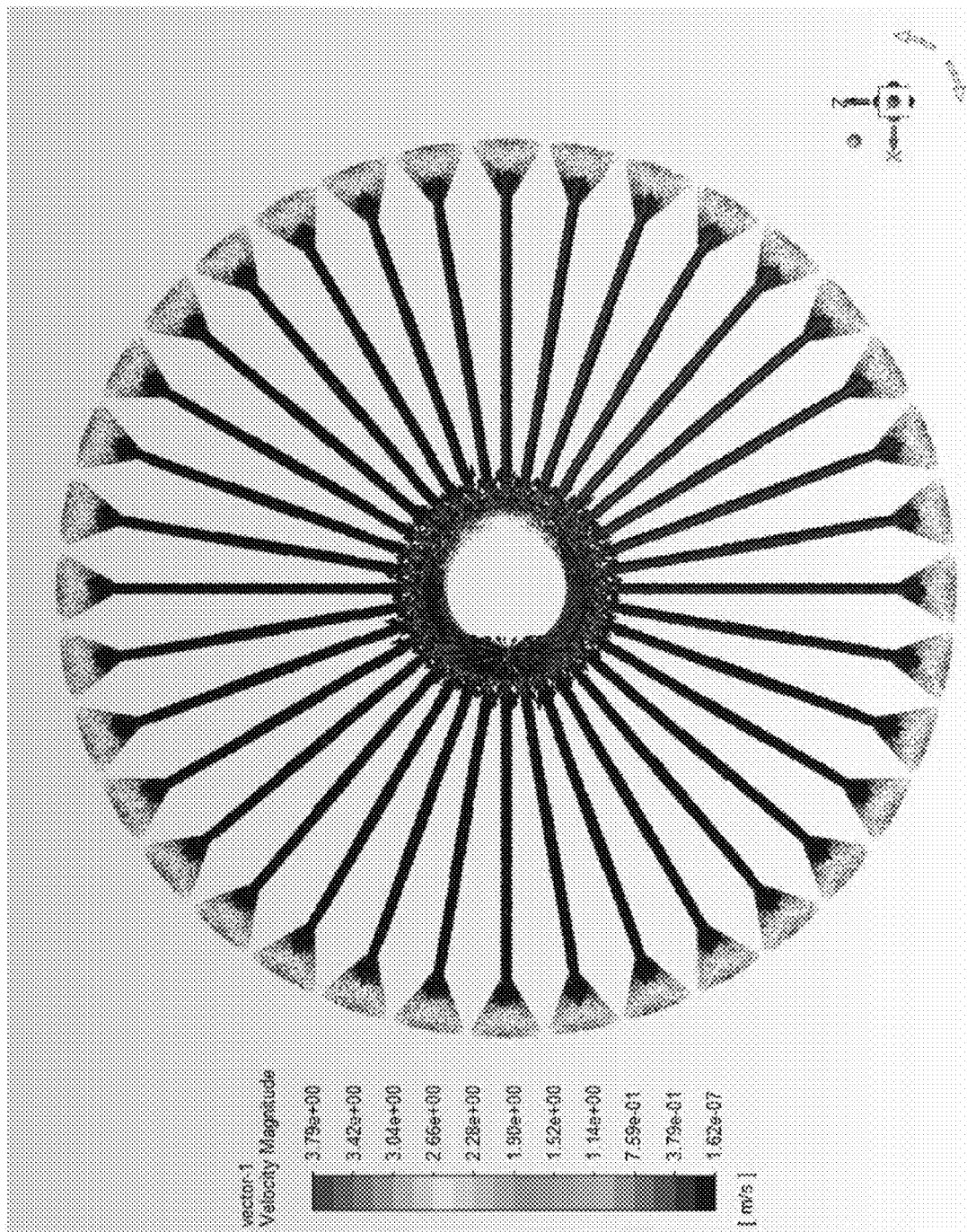
FIGS. 7A, 7B, and 7C show various perspectives of vector maps showing magnitudes and directions of velocities of gas flow through a channel.
Figure 7B:
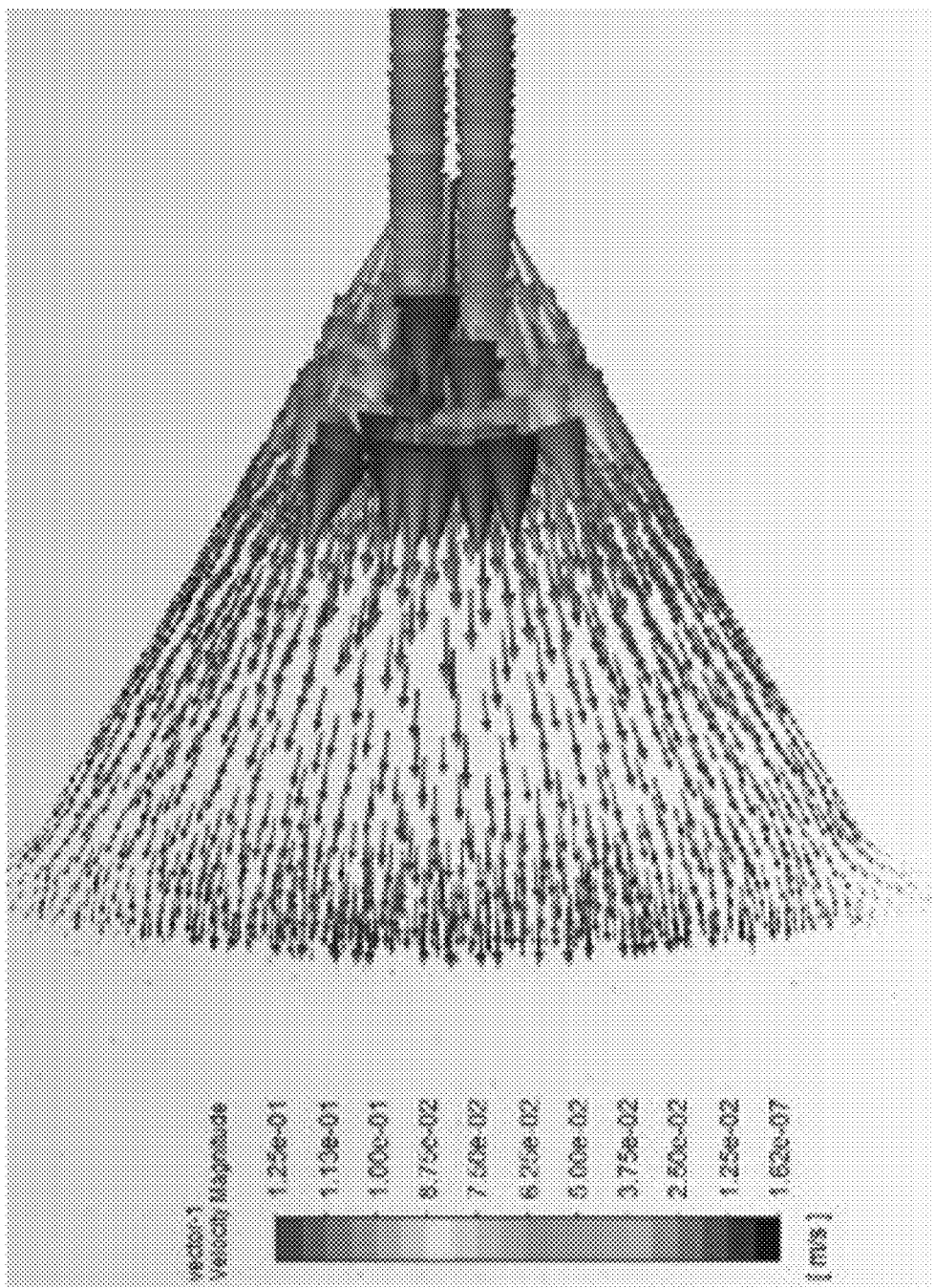
Figure 7C:
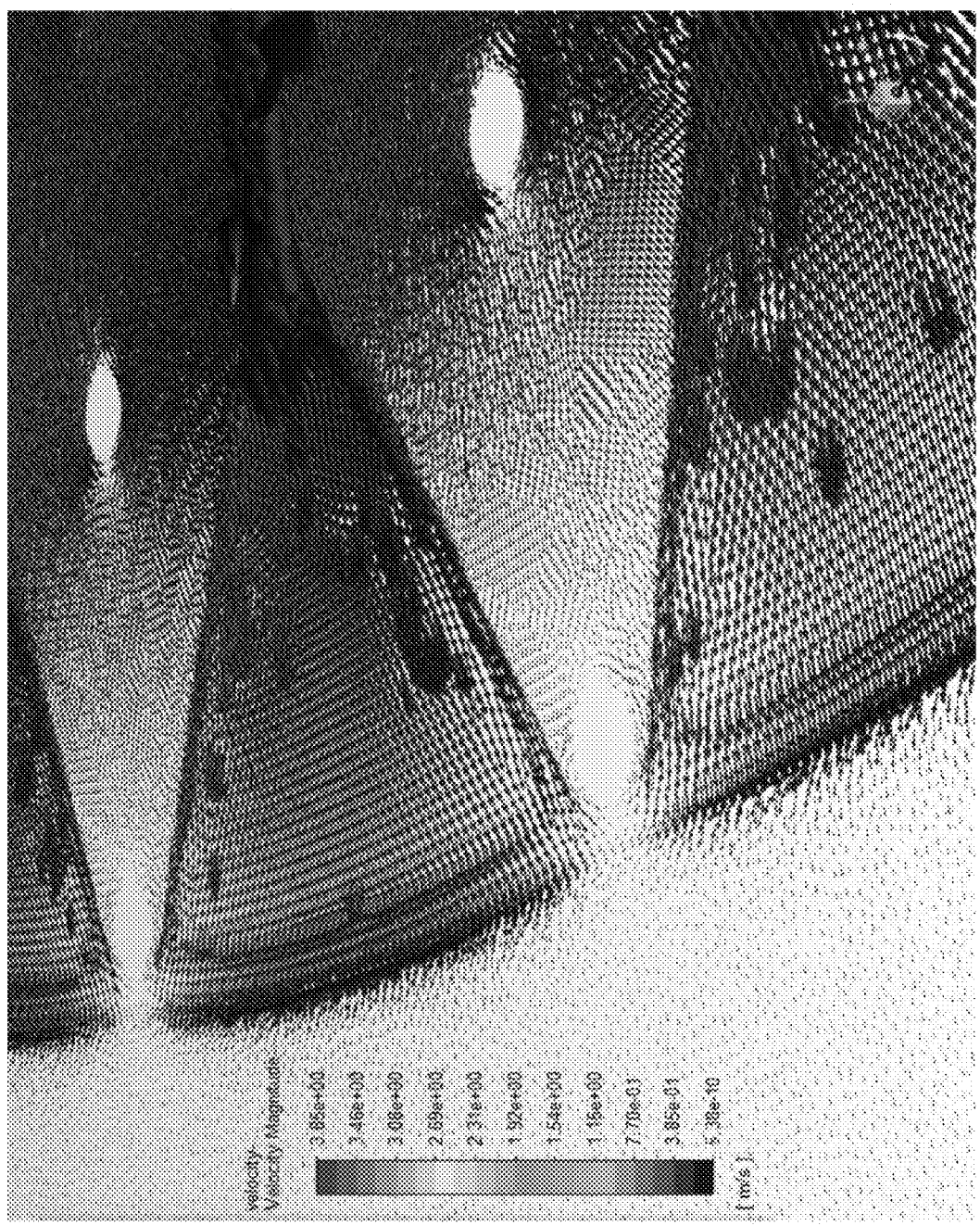

FIGS. 7A, 7B, and 7C show various perspectives of vector map simulations showing magnitudes and directions of velocities of gas flow through a channel. FIG. 7B shows a higher magnitude of velocities of gas particles immediately exiting the elongate portion of the corresponding channel. Beyond the exit of the elongate portion, velocities decrease, and further decrease within the flash-out portion as the width and cross-sectional area expands. This allows the velocities of gas particles to be substantially uniform around a purge perimeter (e.g., the purge perimeter 226) formed by the distal ends of the plurality of channels, at the outlet of the flash-out portions. The term "substantially uniform" may include producing respective velocities for at least a certain percentage (e.g., 50%, 75%, 80%, 90%, 95%, etc.) of the gas particles that do not vary by more than a standard deviation from a mean velocity of the gas particles.

Figure 8:
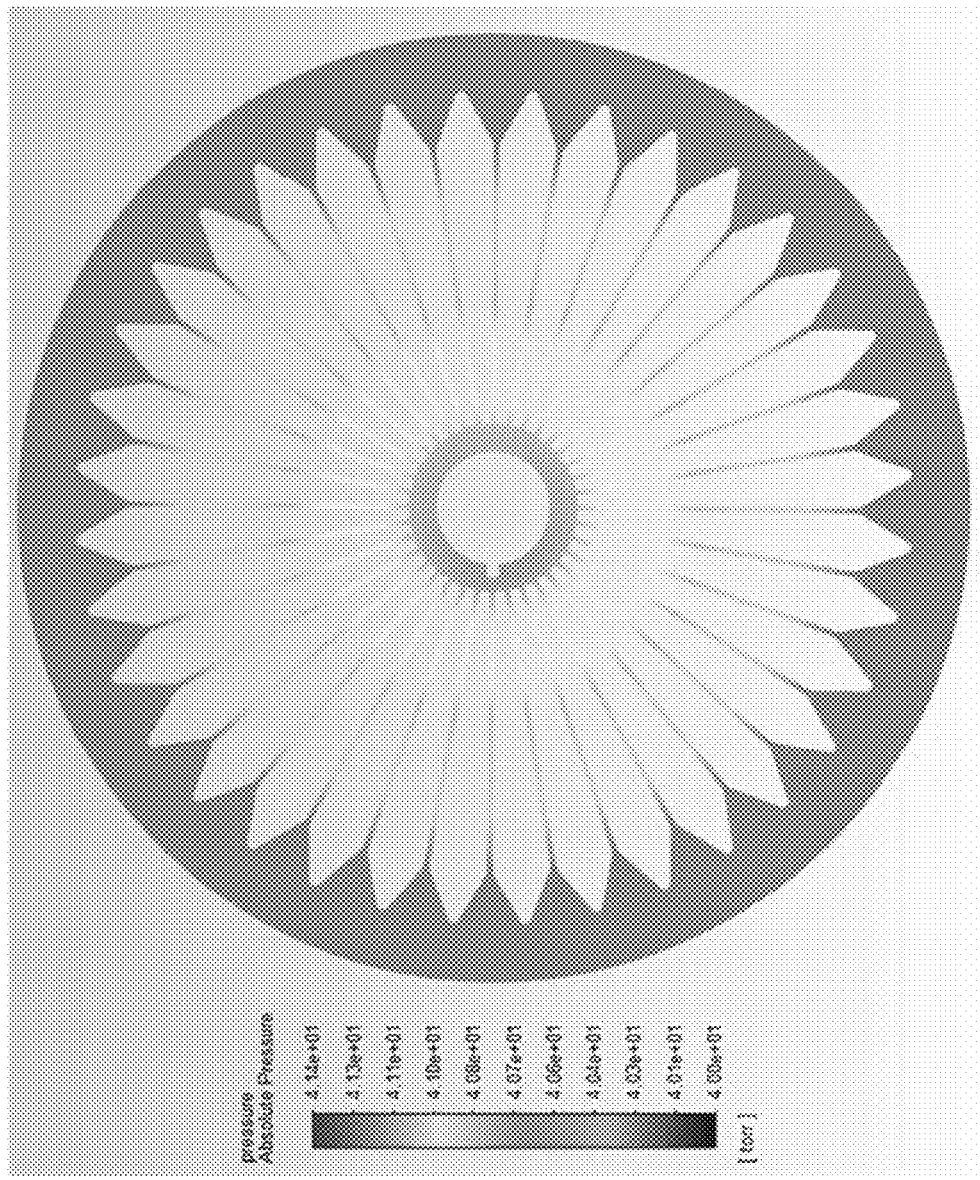
FIG. 8 shows a heat map of pressure across an example susceptor.

FIGS. 7A-7C and 8 show a perspective of a vector map showing magnitudes and directions of gas flow through a channel. FIG. 8 shows similar results as FIGS. 7A-7C, but for pressure. In sum, FIG. 8 shows a higher magnitude of pressure of gas particles immediately exiting the elongate portion of the corresponding channel, which decreases and spreads out through the flash out portion. Pressures further decrease within the flash-out portion as the width and cross-sectional area expands. This allows the pressures of gas to be substantially uniform around the purge perimeter formed by the distal ends of the plurality of channels, at the outlet of the flash-out portions. The term "substantially uniform" may include producing respective pressures for at least a certain percentage (e.g., 50%, 75%, 80%, 90%, 95%, etc.) of the gas particles that do not vary by more than a standard deviation from a mean velocity of the gas particles. FIGS. 7A-8 demonstrate how configurations of susceptors with embodiments of the channels herein can provide improved uniformity in flow, including pressure and velocity, around the perimeter of a substrate supported on the susceptor. This improved uniformity in flow can in turn reduce backside deposition onto the susceptor, improving substrate yield and reducing substrate waste.

The present aspects and implementations may be described in terms of functional block components and various processing steps. Such functional blocks may be realized by any number of hardware or software components configured to perform the specified functions and achieve the various results. For example, the present aspects may employ various sensors, detectors, flow control devices, heaters, and the like, which may carry out a variety of functions. In addition, the present aspects and implementations may be practiced in conjunction with any number of processing methods, and the apparatus and systems described may employ any number of processing methods, and the apparatus and systems described are merely examples of applications of the invention.

What is claimed is:

1. A susceptor comprising:
   a face configured to support a substrate thereon;
   an inner region, wherein the inner region centered on a center of the face; and
   a channel region, wherein the channel region is disposed radially outward from the inner region, wherein the channel region comprises a plurality of channels, a plurality of elevated regions, and an outer rim disposed radially outward from the plurality of channels,
   wherein the plurality of channels extends into the face and radially outwardly from the inner region to the outer rim, wherein each of the plurality of channels spans between two elevated regions, each of the plurality of channels comprising:
      an elongate portion having an elongate portion width; and
      a flash-out portion in fluid communication with the elongate portion, the flash-out portion comprising a distal end at the outer rim, a first section having a first width and a second section having a second width greater than the first width, wherein the first section is disposed radially inward of the second section, and wherein each of the plurality of channels spans the second width, and
   wherein the plurality of elevated regions extend radially outwardly from the inner region to the outer rim, wherein each of the plurality of elevated regions spans between two adjacent channels, wherein each of the plurality of channels spans between two adjacent elevated regions.

2. The susceptor of claim 1, wherein the channel region comprises a recess configured to support a substrate, wherein the outer rim comprises an outer boundary of the recess.

3. The susceptor of claim 1, wherein the elongate portion width is substantially constant along a radial length of the elongate portion.

4. The susceptor of claim 1, wherein the plurality of channels are regularly spaced.

5. The susceptor of claim 1, wherein a width of the flash-out portion is greatest at the outer rim.

6. The susceptor of claim 1, wherein the flash-out portion comprises a substantially triangular shape from the elongated portion to the outer rim.

7. The susceptor of claim 1, wherein the flash-out portion comprises a first edge and a second edge, the first edge oriented relative to the second edge at an angle of between about 25° and 110°.

8. The susceptor of claim 7, wherein the plurality of channels comprises a first channel and a second channel consecutive with the first channel, wherein the first edge of the second channel and the second edge of the first channel are disposed at an angle therebetween of between about 15° and 100°.

9. The susceptor of claim 7, wherein the plurality of channels comprises a first channel and a second channel consecutive with the first channel, wherein the angle between the first edge and the second edge of the first channel flash-out portion is different from an angle between the first edge and the second edge of the second channel flash-out portion.

10. The susceptor of claim 1, wherein the elongate portion has a depth of between about 0.05 mm and 1.5 mm.

11. The susceptor of claim 4, wherein each set of consecutive channels of the plurality of channels has the same angle between the consecutive channels.

12. The susceptor of claim 1, wherein two consecutive elongate portions of the plurality of channels form an angle of between about 3° and 25°.

13. The susceptor of claim 1, further comprising:
   a back surface opposite the face; and
   one or more apertures extending between the face and the back surface, the one or more apertures configured to allow for pins to extend therethrough and lift a substrate from the face of the susceptor.

14. The susceptor of claim 13, wherein the one or more apertures are disposed between the first elongate portion and a consecutive elongate portion of a second channel of the plurality of channels.

15. The susceptor of claim 13, wherein the one or more apertures comprises at least three apertures, and wherein an angular separation between each radially consecutive aperture of the at least three apertures is substantially equal.

16. The susceptor of claim 1, wherein a cross section of the elongate portion comprises:
   first and second sidewalls, each of the first and second sidewalls being substantially flat, wherein the first and second sidewalls are disposed at an acute angle relative to each other.

17. The susceptor of claim 1, further comprising a ring channel extending into the face and disposed radially inward of and in fluid communication with at least one of the plurality of channels.

18. A susceptor comprising:
   a face configured to support a substrate thereon;
   a plurality of channels extending into the face and radially outwardly relative to a center of the face, each of the plurality of channels comprising a distal end, the distal ends of the plurality of channels forming an annular purge perimeter, the plurality of channels configured to produce at least one of a substantially uniform velocity and pressure of gas around the purge perimeter, during a radial flow of gas through the channels; and
   a plurality of elevated regions extending radially outwardly to the purge perimeter, wherein each of the plurality of elevated regions spans between two channels, wherein a width of each of the plurality of channels is greatest at the distal end, and wherein each of the plurality of channels spans a width of the distal end.

19. The susceptor of claim 18, wherein the plurality of channels are configured such that the at least one of substantially uniform velocity and pressure of gas around the purge perimeter comprises maintaining, for each of at least 75% of particles of the gas, a velocity that does not vary by more than a standard deviation from a mean velocity of all of the gas particles.

20. A reaction chamber comprising the susceptor of claim 1, further comprising a showerhead configured to direct a flow of gas substantially perpendicular to the face.

* * * * *